United States Patent
Zhang et al.

(10) Patent No.: US 8,591,245 B2
(45) Date of Patent: Nov. 26, 2013

(54) ELECTRICAL CONNECTOR HAVING IMPROVED COVER PLATE

(75) Inventors: Jiang-Bo Zhang, Shenzhen (CN); Wen He, Shenzhen (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 53 days.

(21) Appl. No.: 13/345,743

(22) Filed: Jan. 8, 2012

(65) Prior Publication Data

US 2012/0178308 A1    Jul. 12, 2012

(30) Foreign Application Priority Data

Jan. 8, 2011  (CN) .......................... 2011 2 0004591

(51) Int. Cl.
*H01R 13/625*  (2006.01)
(52) U.S. Cl.
USPC ....................................................... 439/342
(58) Field of Classification Search
USPC ....................................................... 439/342
See application file for complete search history.

(56) References Cited

U.S. PATENT DOCUMENTS

| | | | |
|---|---|---|---|
| 6,338,640 B1* | 1/2002 | Lin | 439/342 |
| 6,692,281 B1 | 2/2004 | McClinton et al. | |
| 6,733,321 B2* | 5/2004 | Okita et al. | 439/342 |
| 7,052,302 B2* | 5/2006 | Lei et al. | 439/342 |
| 7,094,090 B2* | 8/2006 | He et al. | 439/342 |
| 7,114,978 B2* | 10/2006 | He et al. | 439/342 |
| 7,892,009 B2* | 2/2011 | Szu | 439/342 |
| 8,202,109 B2* | 6/2012 | Zhou et al. | 439/342 |
| 2004/0147155 A1* | 7/2004 | Hirata et al. | 439/342 |
| 2005/0042909 A1* | 2/2005 | Sun | 439/342 |
| 2007/0035319 A1* | 2/2007 | He et al. | 324/755 |

* cited by examiner

*Primary Examiner* — Gary F. Paumen
(74) *Attorney, Agent, or Firm* — Wei Te Chung; Ming Chieh Chang

(57) ABSTRACT

An electrical connector includes a base (1) with a plurality of passageways (11), a number of contacts (12) received in the passageways (11), a cover (2) assembled to the base (1), a cam (3) mounted to the cover (2) and the base (1) and rotatable to drive the cover (2) to move relative to the base (1), a cover strip (26) assembled to the cover (2) and a base strip (16) assembled to the base (1), the cover (2) comprises a number of through holes (21) corresponding to the passageways (11), the cover strip (26) is manufactured by bending a metal strip and has a U-shaped body portion (261) and a pair of stoppers (262) bending upwardly from free ends of the body portion (261) to engage with the cam (3).

18 Claims, 5 Drawing Sheets

ELECTRICAL CONNECTOR HAVING IMPROVED COVER PLATE

BACKGROUND OF THE INVENTION

1. Field of the Invention

The present invention relates to an electrical connector, and more particularly to an electrical connector for a Pin Grid Array (PGA) package, which has a cover plate manufactured by bending a metal strip.

2. Description of the Prior Art

U.S. Pat. No. 6,338,640 issued to Lin on Jan. 15, 2002 discloses a conventional electrical connector for electrically connecting a CPU (Central Process Unit) with a PCB (Printed Circuit Board). The electrical connector comprises an insulative base, a cover mounted to the base, a plurality of terminals received in the base, a metallic cam actuator and a protecting mechanism assembled to the base and the cover. The cover has a plurality of through holes corresponding to the terminals, thus permit lead pins of the CPU to be inserted in the through holes to connect with the terminals. The base and the cover are slidably interconnected so that the cover is driven in a plane parallel to the base between a first position and a second position. In the first position, the lead pins of the CPU can pass through the through holes of the cover without insertion force. In the second position, the lead pins of the CPU contact with the terminals. The protecting mechanism comprises a T-shaped metal cover plate inserted in the cover and a T-shaped metal bottom plate received in a recess of the base. The cover plate and the bottom plate are both manufactured by die casting and which makes the cover plate has a complex manufacture process and a high cost.

Therefore, it is need to find a new electrical connector having an improved cover plate to overcome the problems mentioned above.

SUMMARY OF THE INVENTION

Accordingly, an object of the present invention is to provide an electrical connector having a cover plate manufactured by bending a metal strip to reduce the cost and is easy to be manufactured.

In order to achieve the object set forth, An electrical connector comprises a base with a plurality of passageways, a plurality of contacts received in the passageways, a cover assembled to the base, a cam mounted to the cover and the base and rotatable to drive the cover to move relative to the base, a cover strip assembled to the cover and a base strip assembled to the base, the cover comprises a plurality of through holes corresponding to the passageways, the cover strip is manufactured by bending a metal strip and comprises a U-shaped body portion and a pair of stoppers bending upwardly from free ends of the body portion to engage with the cam.

DESCRIPTION OF PREFERRED EMBODIMENT

Reference will now be made to the drawings to describe the present invention in detail.

Figure 1:
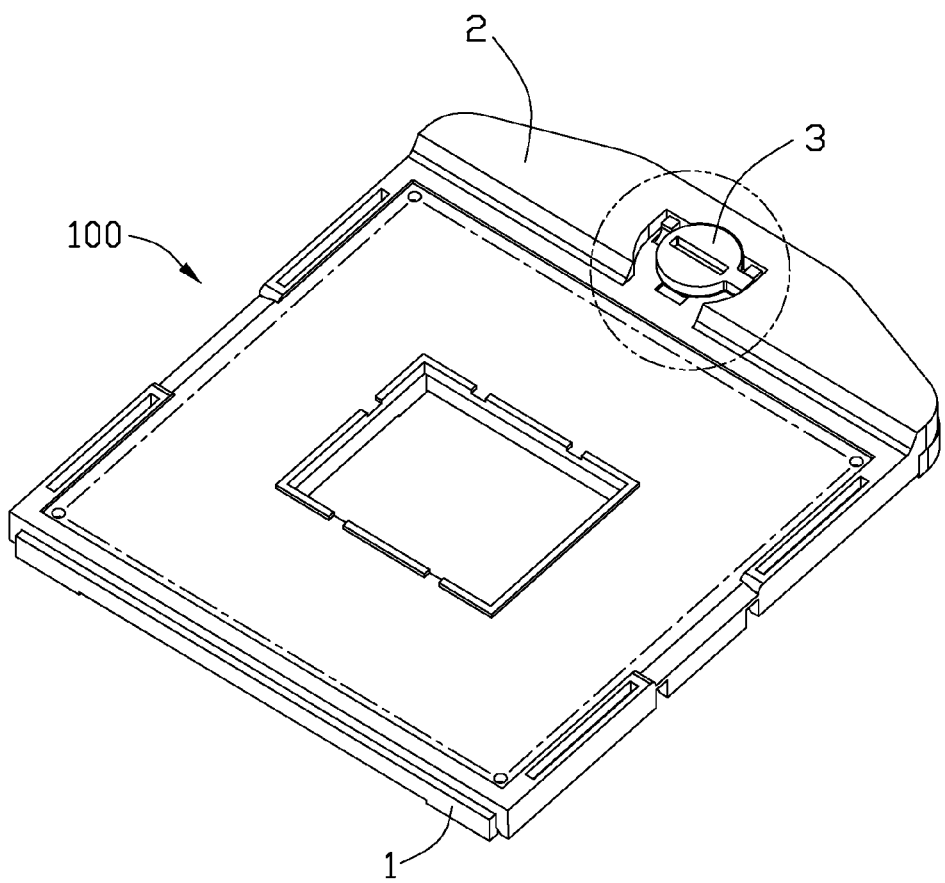
FIG. 1 is an assembled view of an electrical connector according to the present invention.
Figure 2:
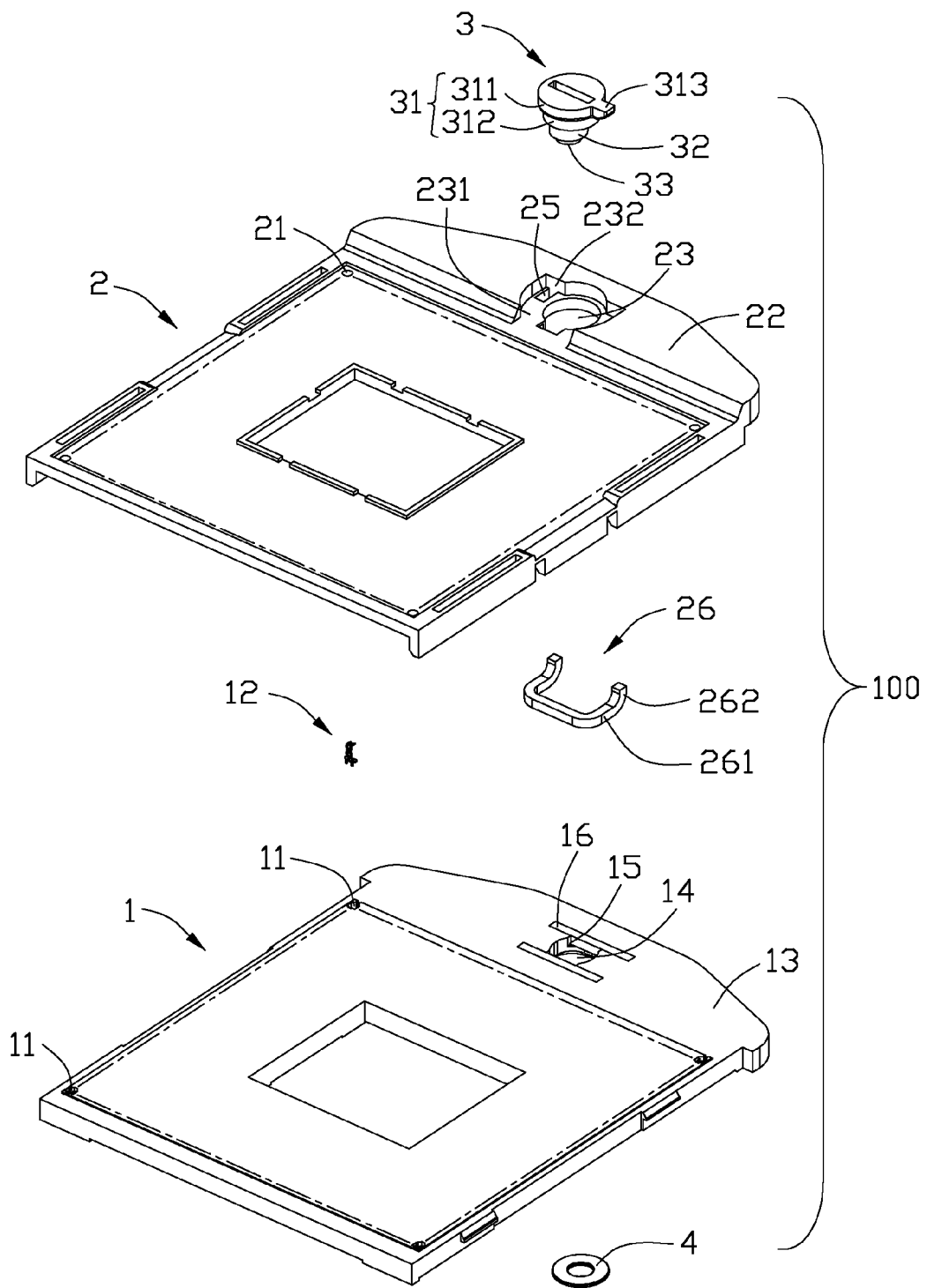
FIG. 2 is an exploded view of the electrical connector shown in FIG. 1.
Figure 3:
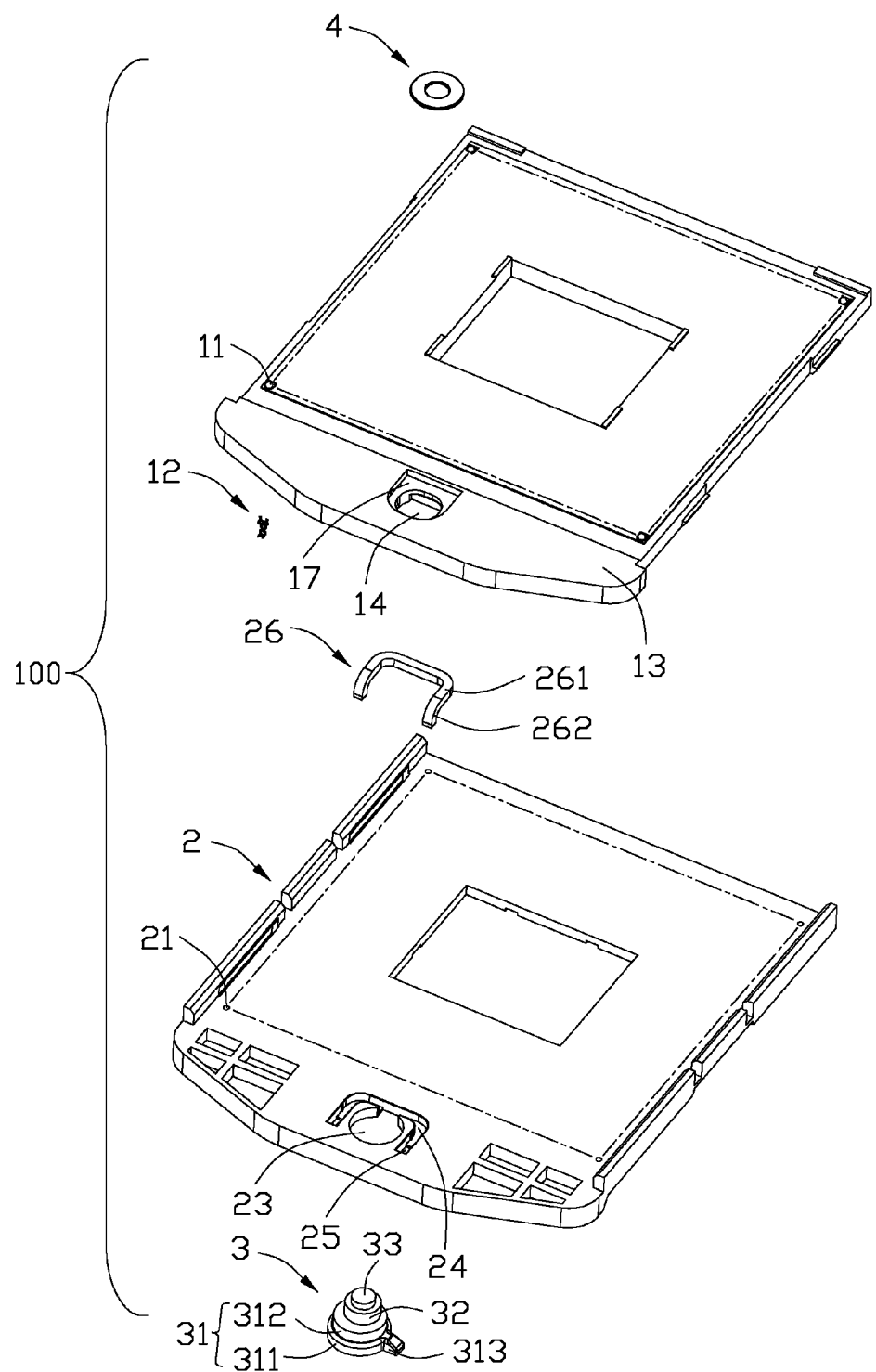
FIG. 3 is another exploded view of the electrical connector shown in FIG. 1.
Figure 4:
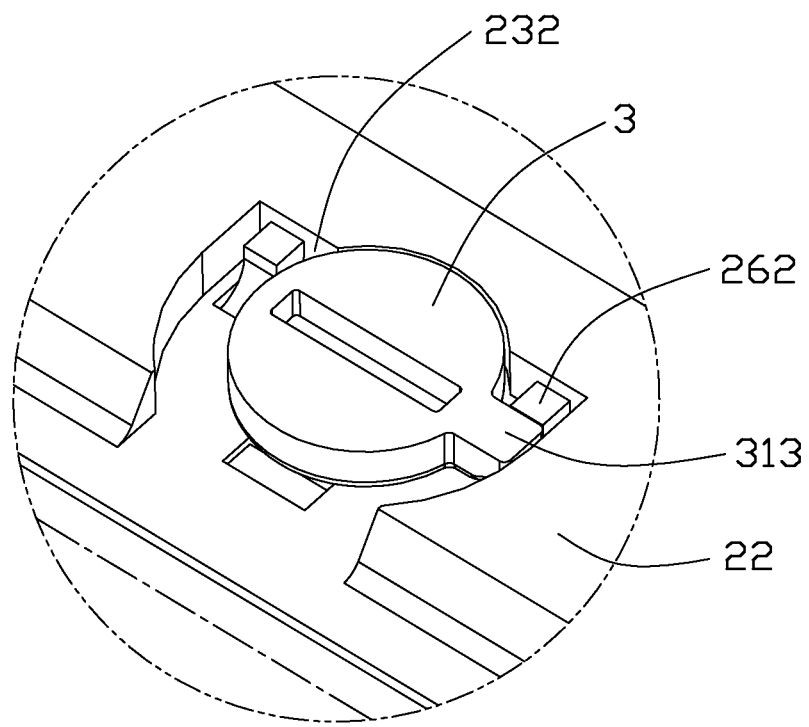
FIG. 4 is an enlarged view of the circular portion shown in FIG. 1.
Figure 5:
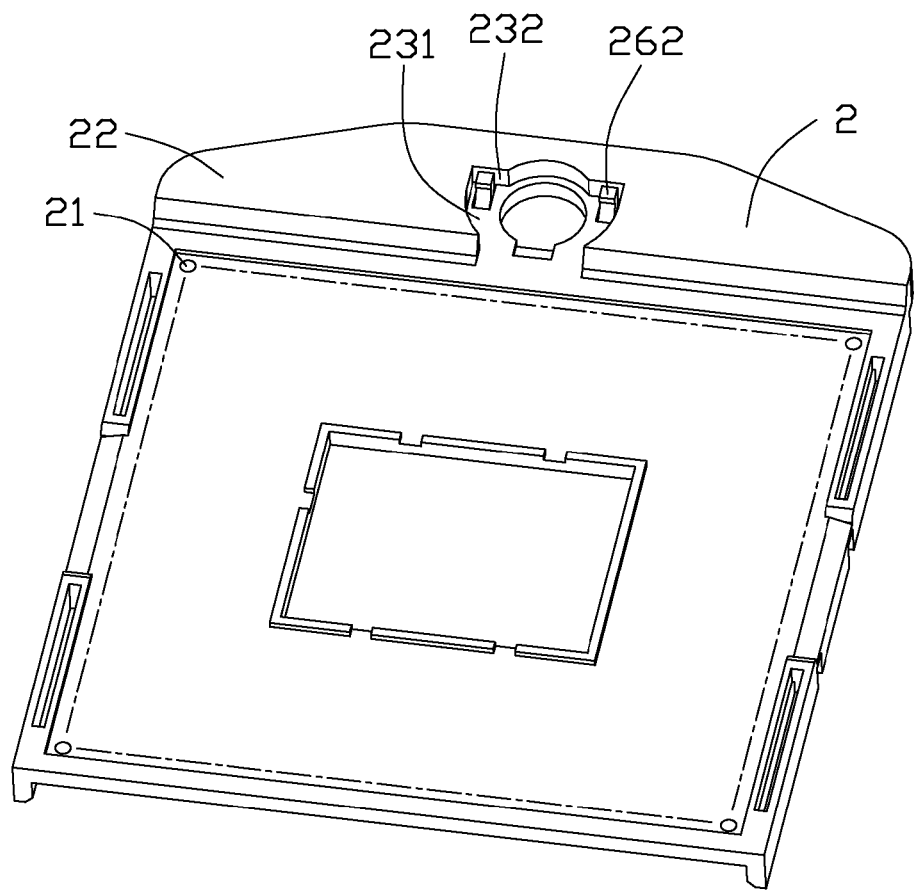
FIG. 5 is an assembled view of the cover and the cover strip shown in FIG. 2.

FIG. 2 to FIG. 3 shows an electrical connector 100 for electrically connecting a printed circuit board (not shown) to a Pin Grid Array (PGA) package (not shown). The electrical connector 100 comprises a base 1, a plurality of contacts 12 received in the base 2, a cover 2 slidably mounted to the base 1, a cam 3 mounted to the cover 2 and the base 1, a cover strip or cover holding 26 mounted on the cover 2, a base strip or base holder 16 mounted in the base 1 and a washer 4 assembled to the cam 3.

The base 1 with a substantially rectangular configuration is made of insulative material and defines a plurality of passageways 11 to receive the contacts 12. The base 1 comprises a head 13 at one end thereof and the head 13 defines a pair of upper recesses 15 with linear shape at an upper surface thereof, a lower recess 17 at a lower surface thereof and a base hole 14 penetrates the upper surface and the lower surface. The base hole 14 penetrating the head 13 for receiving the cam 3 and the pair of upper recesses 15 are located on opposite sides of the base hole 14 and communicating with the base hole 14. The washer 4 is received in the lower recess 17.

The cover 2 is mounted to the base 1 and has a plurality of through holes 21 corresponding to the passageways 11 of the base 1. The cover 2 is able to move between an opened position in which pins (not shown) of the PGA package (not shown) can pass through the through holes 21 of the cover 2 and a closed position in which the pins of the PGA package contact with the contacts 12. The cover 2 has a head portion 22 at one end thereof corresponding to the head 13 of the base 1. The head portion 22 defines a cover hole 23 penetrates the head portion 22 corresponding to the base hole 14 of the base 1, a U-shaped first concave 24 at a bottom surface and a second concave 231 at a top surface thereof adjacent the cover hole 23. The head portion 22 further defines a pair of holes 25 extending therethrough and communicate with the first concave 24 and the second concave 231. The cover hole 23 disconnects with the first concave 24 in the bottom surface of the cover 2. The pair of holes 25 is located at peripheral of the cover hole 23. The second concave 231 is formed with two semicircles having different diameters, and there are two vertical sidewalls 232 on the two semicircles intersectant place. The two vertical sidewalls 232 are formed near the pair of holes 25.

The base strip 16 are two metallic strips with rectangular cross sections received in the upper recess 15 of the base 1. The cover strip 26 is manufactured by bending a metal strip and comprises a U-shaped body portion 261 and a pair of stoppers 262 bending upwardly from free ends of the U-shaped body portion 261. The U-shaped body portion 261 is received in the U-shaped first concave 24 of the cover 2 and the pair of stoppers 262 go through the holes 25 and project into the second concave 231 to depend on the vertical sidewall 232 of the cover 2.

The cam 3 comprises an upper post 31, a middle post 32 connected with the upper post 31 and a lower post 33 connected with the middle post 32. The lower post 33 is coaxial with the middle post 32, and the upper post 31 is non-coaxial with the middle post 32. The upper post 31 is received in the cover hole 23 of the cover 2, the middle post 32 is received in the base hole 14 of the base 1 and the lower post 33 is assembled with the washer 4. The upper post 31 comprises a first post 311 and a second post 312, the first post 311 defines a protruding portion 313 received in the second concave 231.

When assemble the electrical connector 100, first mount the base strip 16 to the upper recess 15 of the base 1, second mount the cover strip 26 to the first concave 24 of the cover 2, third assemble the cover 2 to the base 1 and put the cam 3 to the cover 2 to make it goes through the cover hole 23 and the base hole 14, finally assemble the washer 6 to the lower post 33 of the cam 3 for fastening the cam 3 to the cover 2 and the base 1. When the cam 3 is rotated, the protrusion 313 is stopped by the stoppers 262 at 180 degree to limit the distance of the cover 3 moving relative to the base 2.

In the present invention, the cover strip 26 has a simple structure and is manufactured by bending a metal strip to make it easy to made and can reduce the cost. At the same time, the cover strip 26 is easy to be assembled o the cover 1.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector, comprising:
a base comprising a plurality of passageways with a plurality of contacts received therein;
a cover assembled to the base and comprising a plurality of through holes corresponding to the passageways;
a cam mounted to the cover and the base and rotatable to drive the cover to move relative to the base; and
a cover strip assembled to the cover and a base strip assembled to the base; and wherein the cover strip is manufactured by bending a metal strip and comprising a U-shaped body portion and a pair of stoppers bending upwardly from free ends of the body portion to engage with the cam.

2. The electrical connector as claimed in claim 1, wherein the cover comprises a head portion at one end thereof which defines a cover hole penetrating the head portion, a U-shaped first concave at a bottom surface thereof, a second concave at an upper surface thereof and a pair of holes communicating the first concave and the second concave.

3. The electrical connector as claimed in claim 2, wherein the pair of holes are located at the peripheral of the cover hole.

4. The electrical connector as claimed in claim 3, wherein the second concave is formed with two semicircles having different diameters, and there are two vertical sidewalls on the two semicircles intersectant place.

5. The electrical connector as claimed in claim 4, wherein the cover strip is located in the first concave and the pair of stoppers go through the pair of holes and project into the second concave to depend on the vertical sidewall of the cover.

6. The electrical connector as claimed in claim 2, wherein the base comprises a head corresponding to the head portion of the cover and the head defines a pair of upper recesses with linear shape at an upper surface and a base hole penetrating therethrough and corresponding to the cover hole.

7. The electrical connector as claimed in claim 6, wherein the base strip are two metallic strips with rectangular cross sections received in the pair of upper recesses.

8. The electrical connector as claimed in claim 6, wherein the cam comprises an upper post, a middle post connected with the upper post and a lower post connected with the middle post, the upper post defines a protruding portion to engage with the pair of stoppers.

9. The electrical connector as claimed in claim 8, wherein the upper post is received in the cover hole, the middle post is received in the base hole and the electrical connector also comprises a washer assembled to the lower post for fastening the cam to the cover and the base.

10. An electrical connector, comprising:
a base comprising a head at one end thereof and the head defining a base hole penetrating therethrough;
a cover mounted to the base and comprising a head portion corresponding to the head of the base and the head portion defining a cover hole penetrating therethrough, a first concave at a bottom surface thereof, a second concave at an upper surface thereof;
a cam assembled to the cover and received in the cover hole and the base hole to drive the cover slide on the base;
a cover strip formed by bending a metal strip with essentially a constant cross-sectional dimension and mounted to the first concave, the cover strip comprising a body portion secured in the first concave and a pair of stoppers at two opposite ends of the body portion projecting into the second concave and engaging with the cam; and
a base strip mounted in the base.

11. The electrical connector as claimed in claim 10, wherein the second concave is formed with two semicircles having different diameters, and there are two vertical sidewalls on the two semicircles intersectant place.

12. The electrical connector as claimed in claim 11, wherein the head comprises a pair of upper recesses with linear shape at an upper surface thereof and communicating with the base hole, and the base strip are two metallic strips with rectangular cross sections received in the pair of upper recesses.

13. An electrical connector comprising:
an insulative base defining a lower actuation region and a lower contact region;
a plurality of passageways formed in the lower actuation region;
a plurality of contacts disposed in the corresponding passageways, respectively;
an insulative cover mounted upon the base in a vertical direction, and moveable relative to the base in a front-to-back direction perpendicular to said vertical direction, said cover defining an upper actuation region and an upper contact region;
a plurality of through holes disposed in the upper contact region and essentially in alignment with the corresponding passageways, respectively;
a cover holder mounted in an underside of the upper actuation region of the cover;
a base holder mounted in a top side of the lower actuation region of the base and generally aligned with the cover holder;
a cam extending through the upper actuation region and the lower actuation region around said cover holder and said base holder, said cam rotatable with regard to the upper actuation region and the lower actuation region and defining a unitary post structure with plural stepped structure on an exterior in a downward converging manner to define an upper post with an upper portion upwardly exposed to an exterior for access by a tool and a lower portion configured with a circle to be directly snugly and intimately received in a corresponding circular through hole in the upper actuation region in an interfacial manner, a middle post below the upper post received in a capsular through hole in the lower actuation region and confronting the base holder in the front-to-back direction; wherein the cover holder includes a main body at a lever, where the lower portion of the upper post is located, and a pair of stopper structures upwardly extending from the main body to another level, where the upper portion of the upper post is located, to stop a transverse protrusion formed on a periphery of the upper portion of the upper post during rotation of the cam.

14. The electrical connector as claimed in claim 13, wherein the upper holder is of a strip manner with several bends.

15. The electrical connector as claimed in claim 14, wherein said upper holder defines a U-like configuration.

16. The electrical connector as claimed in claim 13, wherein the lower holder is of a strip manner with a pair of parallel pieces.

17. The electrical connector as claimed in claim 13, wherein the cam further includes a lower post extending through the lower actuation region and locked with a washer so as to prevent the cam from upward withdrawal from the base and the cover.

18. The electrical connector as claimed in claim 13, wherein the main body of the cover hold is outwardly spaced from the corresponding circular through hole in the upper actuation region.

* * * * *